United States Patent
Huang et al.

(10) Patent No.: US 9,362,381 B2
(45) Date of Patent: Jun. 7, 2016

(54) INSULATED GATE BIPOLAR TRANSISTOR WITH A LATERAL GATE STRUCTURE AND GALLIUM NITRIDE SUBSTRATE AND MANUFACTURING METHOD THEREOF

(71) Applicants: Chih-Fang Huang, Hsinchu (TW); Tsung-Yi Huang, Hsinchu (TW); Chien-Wei Chiu, Yunlin (TW); Tsung-Yu Yang, Kaohsiung (TW); Ting-Fu Chang, Taipei (TW); Tsung-Chieh Hsiao, Changhua (TW); Ya-Hsien Liu, Hsinchu (TW); Po-Chin Peng, Zhubei (TW)

(72) Inventors: Chih-Fang Huang, Hsinchu (TW); Tsung-Yi Huang, Hsinchu (TW); Chien-Wei Chiu, Yunlin (TW); Tsung-Yu Yang, Kaohsiung (TW); Ting-Fu Chang, Taipei (TW); Tsung-Chieh Hsiao, Changhua (TW); Ya-Hsien Liu, Hsinchu (TW); Po-Chin Peng, Zhubei (TW)

(73) Assignee: RICHTEK TECHNOLOGY CORPORATION, Chupei, Hsinchu (TW)

( * ) Notice: Subject to any disclaimer, the term of this patent is extended or adjusted under 35 U.S.C. 154(b) by 0 days.

(21) Appl. No.: 14/971,496

(22) Filed: Dec. 16, 2015

(65) Prior Publication Data
US 2016/0111519 A1    Apr. 21, 2016

Related U.S. Application Data

(62) Division of application No. 14/464,220, filed on Aug. 20, 2014, now Pat. No. 9,252,219.

(30) Foreign Application Priority Data

Sep. 24, 2013  (TW) .............................. 102134200 A

(51) Int. Cl.
| H01L 29/66 | (2006.01) |
|---|---|
| H01L 29/73 | (2006.01) |
| H01L 29/10 | (2006.01) |
| H01L 29/20 | (2006.01) |
| H01L 29/201 | (2006.01) |
| H01L 27/07 | (2006.01) |

(52) U.S. Cl.
CPC ...... *H01L 29/66325* (2013.01); *H01L 27/0722* (2013.01); *H01L 29/1095* (2013.01); *H01L 29/201* (2013.01); *H01L 29/2003* (2013.01)

(58) Field of Classification Search
CPC .......................... H01L 29/73; H01L 29/66325
See application file for complete search history.

(56) References Cited

U.S. PATENT DOCUMENTS

| 5,929,467 | A * | 7/1999 | Kawai | ............... H01L 21/28194 257/192 |
|---|---|---|---|---|
| 6,770,922 | B2 * | 8/2004 | Inoue | ................ H01L 21/28264 257/192 |
| 7,504,321 | B2 * | 3/2009 | Bousquet | ................. C30B 23/02 438/478 |
| 7,872,285 | B2 * | 1/2011 | Hashimoto | .......... H01L 29/0878 257/192 |
| 8,299,737 | B2 * | 10/2012 | Morita | .................... H02P 27/08 257/192 |

\* cited by examiner

*Primary Examiner* — Thanh V Pham
(74) *Attorney, Agent, or Firm* — Tung & Associates

(57) ABSTRACT

The present invention discloses an insulated gate bipolar transistor (IGBT) and a manufacturing method thereof. The IGBT includes: a gallium nitride (GaN) substrate, a first GaN layer with a first conductive type, a second GaN layer with a first conductive type, a third GaN layer with a second conductive type or an intrinsic conductive type, and a gate formed on the GaN substrate. The first GaN layer is formed on the GaN substrate and has a side wall vertical to the GaN substrate. The second GaN layer is formed on the GaN substrate and is separated from the first GaN layer by the gate. The third GaN layer is formed on the first GaN layer and is separated from the GaN substrate by the first GaN layer. The gate has a side plate adjacent to the side wall in a lateral direction to control a channel.

4 Claims, 5 Drawing Sheets

INSULATED GATE BIPOLAR TRANSISTOR WITH A LATERAL GATE STRUCTURE AND GALLIUM NITRIDE SUBSTRATE AND MANUFACTURING METHOD THEREOF

CROSS REFERENCE

This is a Divisional of a co-pending application Ser. No. 14/464,220, filed on Aug. 20, 2014.

The present invention claims priority to TW 102134200, filed on Sep. 24, 2013.

BACKGROUND OF THE INVENTION

1. Field of Invention

The present invention relates to an insulated gate bipolar transistor (IGBT) and a manufacturing method thereof; particularly, it relates to such IGBT which includes a gallium nitride (GaN) substrate and manufacturing method thereof.

2. Description of Related Art

FIG. 1 shows a cross-section view of a prior art insulated gate bipolar transistor (IGBT) 100. As shown in FIG. 1, the IGBT 100 is formed in a silicon substrate or a silicon carbide substrate. The IGBT 100 includes a P-type anode 11, an N-type region 12, a P-type region 13, an N-type cathode 14, a gate 15, and an N-type buffer region 16. The IGBT 100 is a vertical double diffusion metal oxide semiconductor (DMOS) IGBT, which includes a vertical DMOS device and a bipolar junction transistor (BJT). The vertical DMOS device includes the gate 15, the N-type buffer layer 16 as a drain, the N-type region 12 as a drift region, the P-type region 13 as a well, and the N-type cathode 14 as a source. On the other hand, the BJT includes the P-type region 13 as an emitter, the N-type buffer layer 16 as a base, and the P-type anode as a collector. During operation of the IGBT 100, the vertical DMOS device controls the BJT whereby fast switching the high power device BJT.

As shown in FIG. 1, when the IGBT 100 operates, the N-type cathodes 14 and the P-type regions 13 at two sides of the gate 15 form a parasitic junction field effect transistor (JFET). The depletion regions formed by the N-type cathodes 14 and the P-type regions 13 limit the conductive current, deteriorating the performance of the IGBT 100.

Therefore, to overcome the drawbacks in the prior art, the present invention proposes an IGBT and a manufacturing method thereof, to improve the operation speed and reduce the conduction resistance.

SUMMARY OF THE INVENTION

From one perspective, the present invention provides an insulated gate bipolar transistor (IGBT) including: a gallium nitride (GaN) substrate with an upper surface; a first GaN layer with a first conductive type, which is formed on the upper surface, wherein the first GaN layer has a side wall vertical to the upper surface; a second GaN layer with a first conductive type, which is formed on the upper surface; a third GaN layer with a second conductive type or an intrinsic conductive type, which is formed on the first GaN layer, wherein the third GaN layer and the GaN substrate are separated by the first GaN layer; and a gate, which is formed on the GaN substrate, and has a side plate, which is directly or indirectly connected to the side wall in a lateral direction, for controlling a channel; wherein the second GaN layer is separated from the first GaN layer by the gate.

From another perspective, the present invention provides a manufacturing method of a n insulated gate bipolar transistor (IGBT) including: providing a gallium nitride (GaN) substrate with an upper surface; forming a first GaN layer with a first conductive type on the upper surface, wherein the first GaN layer has a side wall vertical to the upper surface; forming a second GaN layer with a first conductive type on the upper surface; forming a third GaN layer with a second conductive type opposite to the first conductive type or an intrinsic conductive type on the first GaN layer, wherein the third GaN layer and the GaN substrate are separated by the first GaN layer; and forming a gate on the GaN substrate, which has a side plate, which is directly or indirectly connected to the side wall in a lateral direction, for controlling a channel; wherein the second GaN layer is separated from the first GaN layer by the gate.

In one preferable embodiment, the IGBT further including an aluminum gallium nitride (AlGaN) barrier layer, which is formed on the upper surface, and overlays the side wall, wherein the gate is separated from the GaN substrate and the first GaN layer by the AlGaN barrier layer.

In another preferable embodiment, the GaN substrate, the first GaN layer, the third GaN layer, and the gate form a junction field effect transistor (JFET), and the first GaN layer, the second GaN layer, and the GaN substrate form a bipolar junction transistor (BJT), wherein the JFET and the BJT are connected in parallel.

In another preferable embodiment, the GaN substrate, the first GaN layer, the third GaN layer, the AlGaN barrier layer, and the gate form a metal oxide semiconductor field effect transistor (MOSFET), and the first GaN layer, the second GaN layer, and the GaN substrate form a bipolar junction transistor (BJT), wherein the MOSFET and the BJT are connected in parallel.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
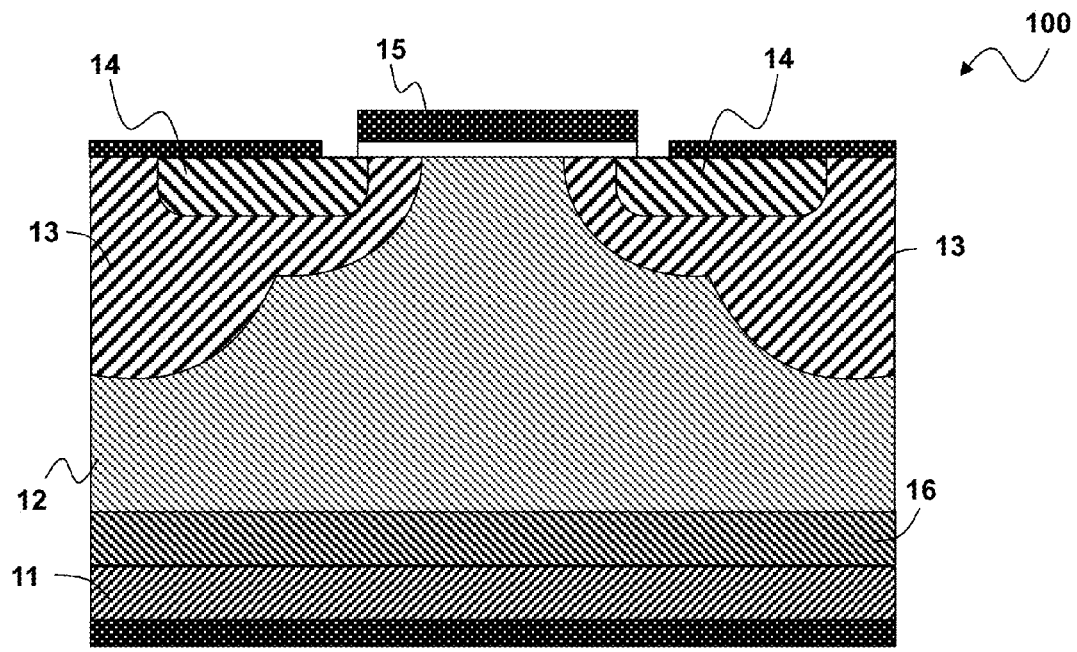
FIG. 1 shows a cross-section view of a prior art insulated gate bipolar transistor (IGBT) 100.
Figure 2A:
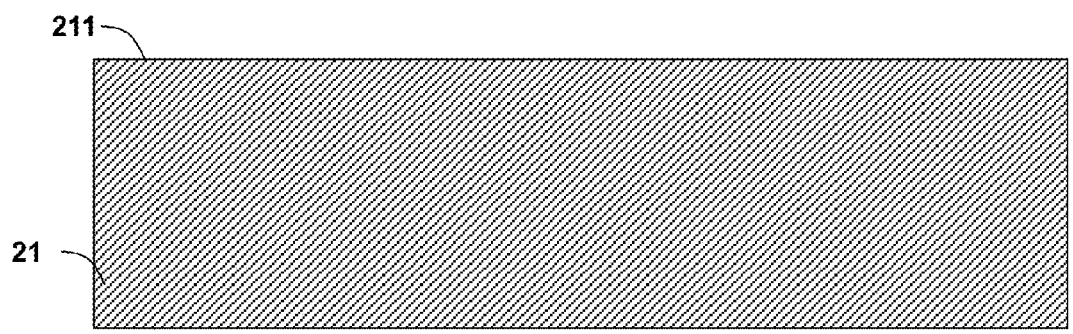
FIGS. 2A-2E show a first embodiment of the present invention.
Figure 2B:
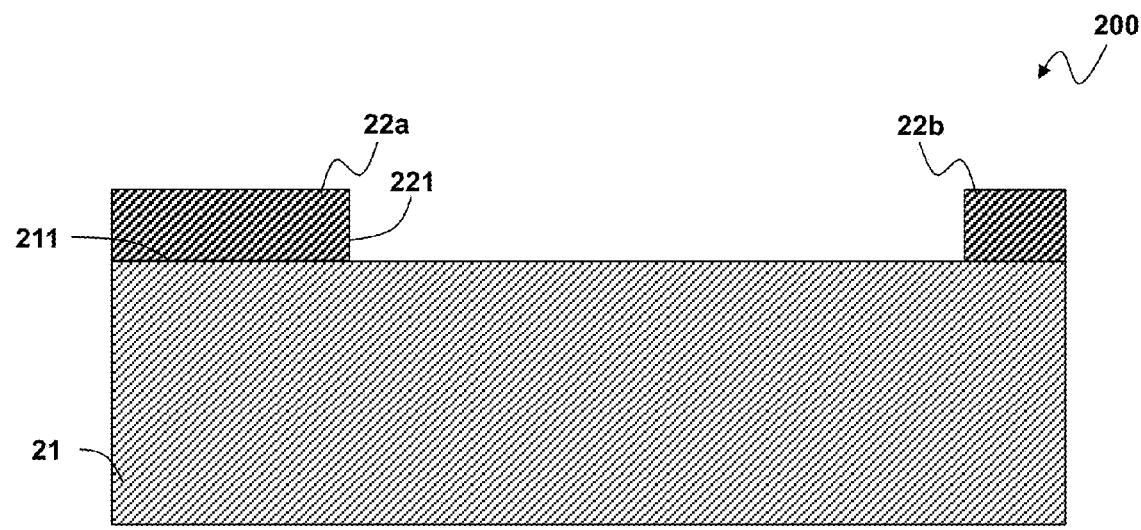
Figure 2C:
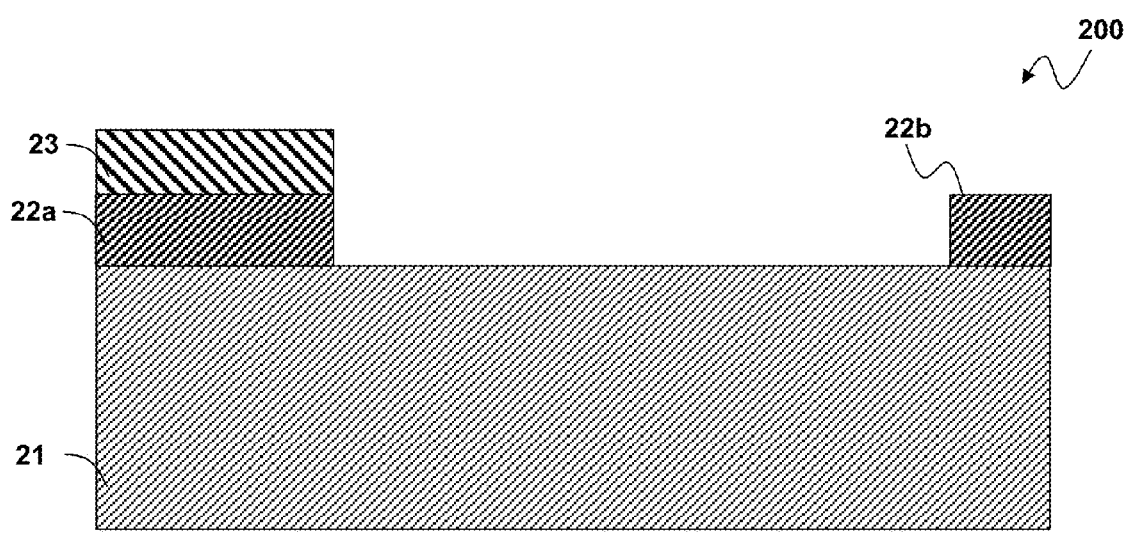
Figure 2D:
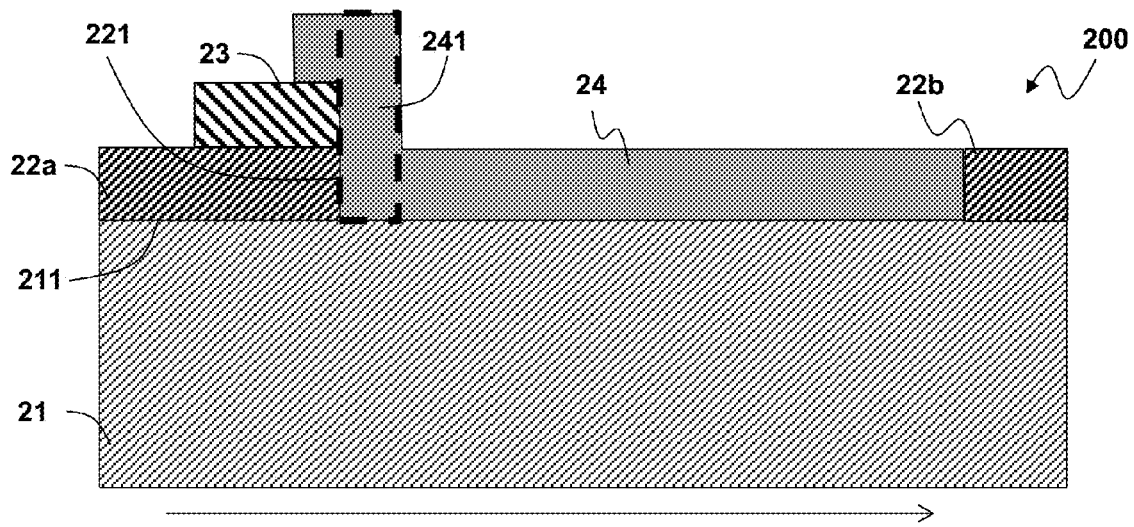
Figure 2E:
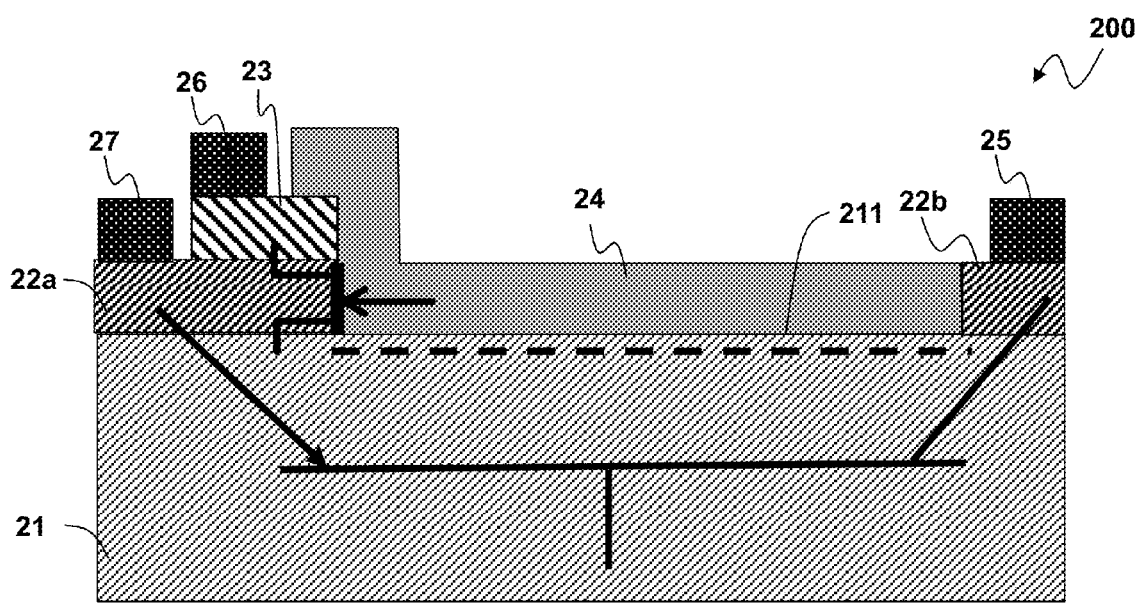

Please refer to FIGS. 2A-2E for a first embodiment according to the present invention, wherein FIGS. 2A-2E are schematic cross-section diagrams showing a manufacturing method of an insulated gate bipolar transistor (IGBT) 200. As shown in FIG. 2A, first, a gallium nitride (GaN) substrate 21 with an upper surface 211 is provided. The GaN substrate 21 is for example but not limited to N-type or intrinsic conductive type. Next, GaN layers 22a and 22b are formed on the upper surface 211 as shown in FIG. 2B, wherein the GaN layers 22a and 22b are for example but not limited to P-type, and the GaN layer 22a has a side wall 221 vertical to the upper surface 211. Next, as shown in FIG. 2C, a GaN layer 23 is formed above the GaN layer 22a, wherein the GaN layer 23 is for example but not limited to N-type or an intrinsic conductive type. The GaN layer 23 and the GaN substrate 21 are separated by the GaN layer 22a. Next, as shown in FIG. 2D, a gate 24 is formed on the GaN substrate 21, and the gate 24 has a side plate 241 (indicated by a dashed frame shown in the figure), which is in contact with (directly connected to) the side wall 221 in a lateral direction (indicated by a solid arrow shown in the figure), for controlling a channel. Next, as shown in FIG. 2E, conductive layers 25, 26, and 27 are formed and electrically connected (preferably with Ohmic contact) to the GaN layer 22b, the GaN layer 23, and the GaN layer 22a respectively as electrical contacts of the GaN layer 22b, the GaN layer 23, and the GaN layer 22a. The GaN substrate 21, the GaN layer 22a, the GaN layer 23, and the gate 24 form a junction field effect transistor (JFET), and the GaN layer 22a, the GaN layer 22b, and the GaN substrate 21 form a bipolar junction transistor (BJT), wherein the JFET and the BJT are connected in parallel. A main current path is formed when the JFET in the IGBT 200 is turned ON, which is the aforementioned channel. In this embodiment according to the present invention, when the JFET is turned ON, a 2 dimensional electron gas (2DEG) as indicated by a dashed line shown in the figure will be formed. A current flowing through the 2DEG is a base current of the BJT, for controlling an emitter-collector current of the BJT. The basic operation principle of a BJT is well known by those skilled in the art, so details thereof are omitted here.

The present invention is different from the prior art IGBT at least in the following aspects. First, the IGBT according to the present invention has a lateral structure, which is different from the vertical structure of the prior art IGBT. The benefit of this difference is that the manufacturing process steps of the lateral IGBT can be more easily integrated with the manufacturing process steps of other semiconductor devices, such as a Schottky-barrier diode (SBD) or a high electron mobility transistor (HEMT), so the manufacturing cost and the overall product size can be reduced. Second, different from the prior art IGBT using the silicon substrate or the silicon carbide substrate, the IGBT according to the present invention includes the GaN substrate, whereby the operation speed is greatly improved and the IGBT according to the present invention can switch faster than the prior art IGBT. Hence, the IGBT according to the present invention has a broader application range, applicable in a high frequency device.

Figure 3A:
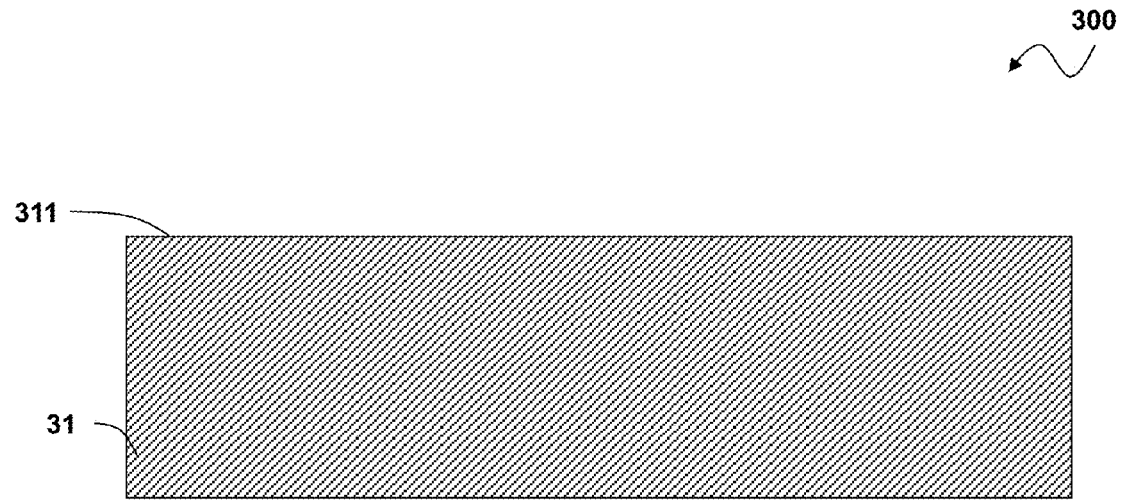
FIGS. 3A-3D show a second embodiment of the present invention.
Figure 3B:
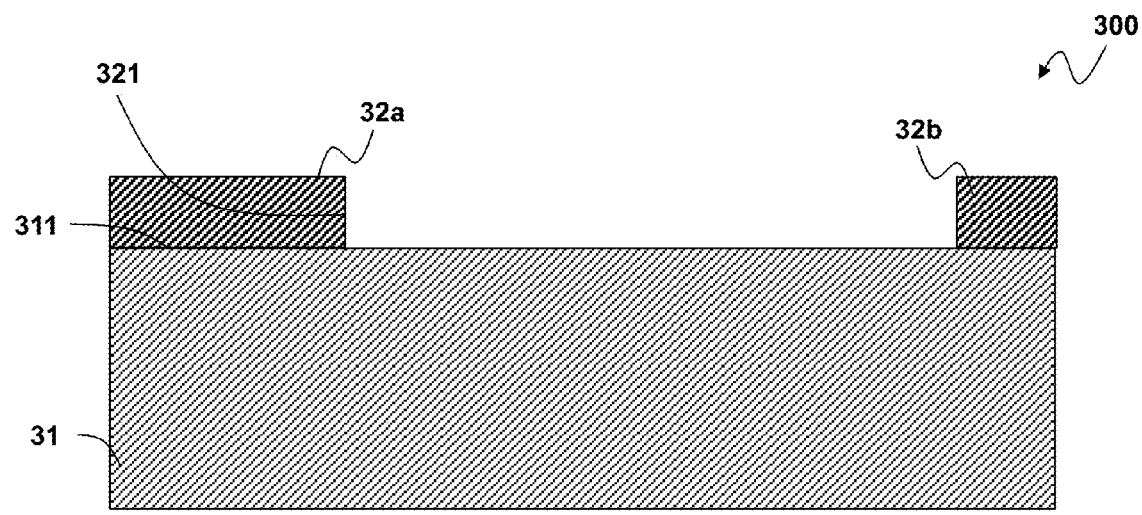
Figure 3C:
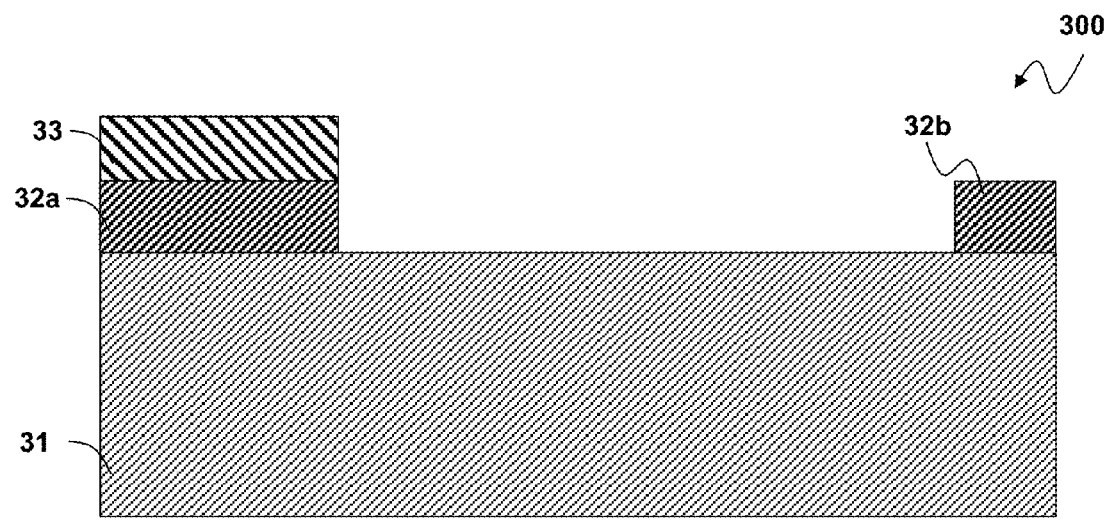
Figure 3D:
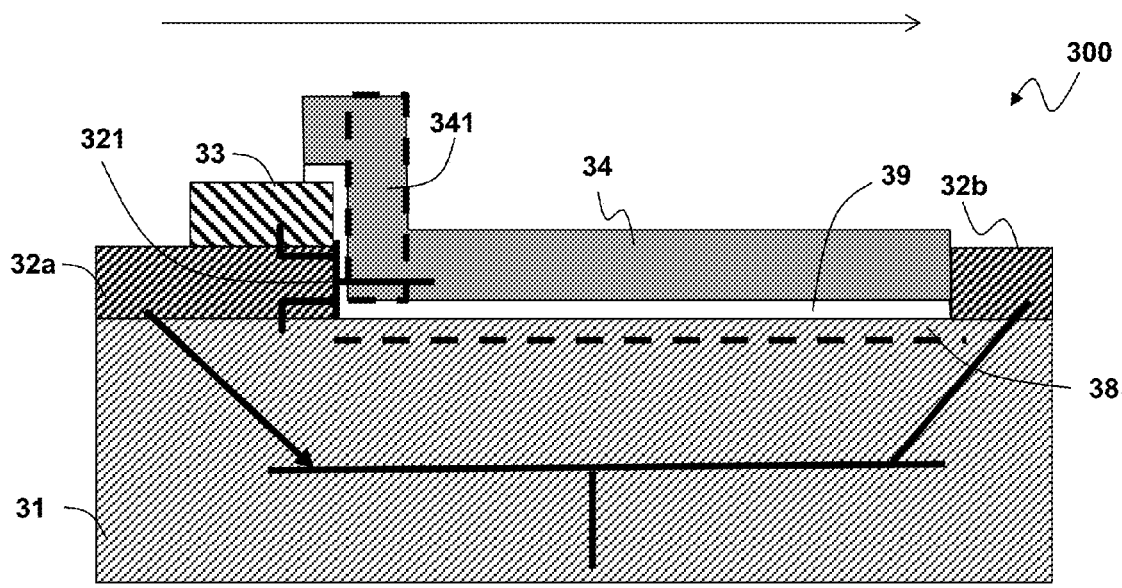

FIGS. 3A-3D show a second embodiment of the present invention. This embodiment is different from the IGBT 200 of the first embodiment in that, the IGBT 300 of this embodiment further includes an aluminum gallium nitride (AlGaN) barrier layer 39, which is formed on the upper surface 311, and overlays the side wall 321. The gate 34 is separated from the GaN substrate 31 and the GaN layer 32a by the AlGaN barrier layer 39. FIGS. 3A-3D are schematic cross-section diagrams showing a manufacturing method of the IGBT 300. As shown in FIG. 3A, first, a GaN substrate 31 with an upper surface 311 is provided. The GaN substrate 31 is for example but not limited to the N-type or the intrinsic conductive type. Next, GaN layers 32a and 32b are formed on the upper surface 311 as shown in FIG. 3B, wherein the GaN layers 32a and 32b are for example but not limited to the P-type, and the GaN layer 32a has a side wall 321 vertical to the upper surface 311. Next, as shown in FIG. 3C, a GaN layer 33 is formed above the GaN layer 32a, wherein the GaN layer 33 is for example but not limited to the N-type or the intrinsic conductive type. The GaN layer 33 and the GaN substrate 31 are separated by the GaN layer 32a. Next, as shown in FIG. 3D, the AlGaN barrier layer 39 and a gate 34 is formed on the GaN substrate 31, and the gate 34 has a side plate 341 (indicated by a dashed frame shown in the figure), which is indirectly connected to the side wall 321 in a lateral direction (indicated by a solid arrow shown in the figure), for controlling a channel. As shown in the figure, in the lateral direction, the side plate 341 is directly connected to the AlGaN barrier layer 39, and the AlGaN barrier layer 39 is directly connected to the side wall 321 of the GaN 32. The GaN substrate 31, the GaN layer 32a, the GaN layer 33, AlGaN layer barrier layer 39, and the gate 34 form a metal oxide semiconductor field effect transistor (MOSFET), and the GaN layer 32a, the GaN layer 32b, and the GaN substrate 31 form a bipolar junction transistor (BJT), wherein the MOSFET and the BJT are connected in parallel.

A main current path is formed when the MOSFET in the IGBT 300 is turned ON, which is the aforementioned channel. In this embodiment according to the present invention, when the MOSFET is turned, a 2 dimensional electron gas (2DEG) 38 as indicated by a dashed line shown in the figure will be formed. A current flowing through the 2DEG 38 is a base current of the BJT, for controlling an emitter-collector current of the BJT. The operation speed of the IGBT 300 is greatly improved because of the 2DEG 38, such that the IGBT 300 according to the present invention can switch faster than the prior art IGBT; beside, the conduction resistance of the IGBT 300 is relatively lower because of the 2DEG 38, such that the IGBT 300 has better operation characteristics.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, "the side wall 221 is vertical to the upper surface 211", should not be interpreted as an exact 90 degree angle between the side wall 221 and the upper surface 211; instead, there may be deviations. For another example, other process steps or structures which do not affect the primary characteristics of the device, such as a deep well, etc., can be added. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A manufacturing method of an insulated gate bipolar transistor (IGBT) comprising:
   providing a gallium nitride (GaN) substrate with an upper surface;
   forming a first GaN layer with a first conductive type on the upper surface, wherein the first GaN layer has a side wall vertical to the upper surface;
   forming a second GaN layer with a first conductive type on the upper surface;
   forming a third GaN layer with a second conductive type or an intrinsic conductive type on the first GaN layer, wherein the third GaN layer and the GaN substrate are separated by the first GaN layer; and
   forming a gate on the GaN substrate, which has a side plate, which is directly or indirectly connected to the side wall in a lateral direction, for controlling a channel;
   wherein the second GaN layer is separated from the first GaN layer by the gate.

2. The manufacturing method of claim 1 further comprising: forming an aluminum gallium nitride (AlGaN) barrier layer on the upper surface, which overlays the side wall, wherein the gate is separated from the GaN substrate and the first GaN layer by the AlGaN barrier layer.

3. The manufacturing method of claim 1, wherein the GaN substrate, the first GaN layer, the third GaN layer, and the gate form a junction field effect transistor (JFET), and the first GaN layer, the second GaN layer, and the GaN substrate form a bipolar junction transistor (BJT), wherein the JFET and the BJT are connected.

4. The manufacturing method of claim 2, wherein the GaN substrate, the first GaN layer, the third GaN layer, the AlGaN barrier layer, and the gate form a metal oxide semiconductor field effect transistor (MOSFET), and the first GaN layer, the second GaN layer, and the GaN substrate form a bipolar junction transistor (BJT), wherein the MOSFET and the BJT are connected.

* * * * *